United States Patent [19]
Yanagisawa

[11] Patent Number: 5,187,550
[45] Date of Patent: Feb. 16, 1993

[54] SEMICONDUCTOR DEVICE

[75] Inventor: Masayuki Yanagisawa, Tokyo, Japan

[73] Assignee: NEC Corporation, Tokyo, Japan

[21] Appl. No.: 826,537

[22] Filed: Jan. 27, 1992

[30] Foreign Application Priority Data

Jan. 28, 1991 [JP] Japan ......................................... 3-8275

[51] Int. Cl.$^5$ ....................... H01L 29/68; H01L 29/06
[52] U.S. Cl. .................................... 257/301; 257/304; 257/399
[58] Field of Search ...................... 357/23.6, 54, 55.51, 357/23.11

[56] References Cited

U.S. PATENT DOCUMENTS

| | | | |
|---|---|---|---|
| 4,794,434 | 12/1988 | Pelley, III | 357/23.6 |
| 4,801,988 | 1/1989 | Kenney | 357/23.6 |
| 4,918,502 | 4/1990 | Kaga et al. | 357/23.6 |
| 4,969,022 | 11/1990 | Nishimoto et al. | 357/23.6 |

OTHER PUBLICATIONS

1988 Symposium on VLSI Technology Digest of Technical Papers (MINT), Kenney et al., "16-MBIT Merged Isolation and Node Trench SPT Cell (MINT)", pp. 25-26.

A Substrate-Plate Trench-Capacitor (SPT) Memory Cell For Dynamic Ram's, IEEE Journal of Solid-State Circuits, vol. SC-21, No. 5, Oct. 1986, pp. 627-634, by Nicky Chau-Chun Lu, et al.

Primary Examiner—Mark V. Prenty
Attorney, Agent, or Firm—Burns, Doane, Swecker & Mathis

[57] ABSTRACT

A storage electrode of a trench capacitor is connected through a trench side wall contact hole to a source/-drain region. A $p^+$ region is provided between the source/drain region and an $n^+$ region which is a part of a cell plate, and is opposite through a silicon oxide film and a capacitive insulation film to the storage electrode.

3 Claims, 15 Drawing Sheets

SEMICONDUCTOR DEVICE

FIELD OF THE INVENTION

The invention relates to a semiconductor device, and more particularly to, a semiconductor device having trench capacitors for DRAM cells.

BACKGROUND OF THE INVENTION

In a conventional semiconductor device, trenches are widely used as capacitors for DRAM cells, in which a gate electrode of a MOS transistor is used as a word line, and one of source and drain regions of the MOS transistor is connected to a bit line, while the remaining one of the source and drain regions is used as one of electrodes for the capacitor. In such a capacitor, an insulation film which is grown on an inner wall thereof is a capacitive insulation film, and a conductor which is buried in the interior thereof is a plate electrode.

On the other hand, a substrate is used as a plate electrode (cell plate) in a substrate-plate trench-capacitor (SPT) for avoiding soft error due to α particles. In this structure, an n well is grown on the surface a p+ silicon substrate for the plate electrode, and source and drain regions are provided on the n well surface to be in self-alignment relative to a gate electrode for a word line. The SPT capacitor is provided to be proximate to one of the source and drain regions and across the n well surface and the p+ silicon substrate, and is connected to the proximate region of the source and drain regions by a conduction film grown on the n well surface. The other one of the source and drain regions is connected through a bit contact to a bit line.

For the purpose of providing an improved SPT capacitor, a structure of a merged isolation and node trench (MINT) has been proposed on pages 25 and 26 of "1988 symposium on VLSI technology digest of technical papers".

Although this structure will be explained later in detail, a trench capacitor which is grown at a node of a memory cell functions as a device separation region, so that the size of the memory cell can be small.

However, the conventional semiconductor device of the MINT structure has first to third disadvantages as set out below.

First, a memory cell is limited to be made small in size, because a MOS transistor which is formed on the surface of an n well grown on a p+ substrate and a storage electrode which is formed in the trench capacitor are connected by a surface strap, so that a predetermined margin of an alignment is required therebetween.

Second, the effect of a parasitic field effect transistor is relieved by the existence of an oxide collar provided at the inner top of the trench capacitor, but it is not sufficient. This is because the oxide collar does not reach the p+ silicon substrate, so that the storage electrode is in contact only through a capacitive insulation film with the n well. For this structure, the effect of the parasitic field effect transistor is not suppressed, so that leakage occurs between a portion of the source and drain regions and the p+ silicon substrate.

Third, leakage occurs between the n well and the p+ silicon substrate due to the formation of a parasitic gate control diode (GCD) formed by the storage electrode, the source and drain regions connected thereto, and the oxide collar.

SUMMARY OF THE INVENTION

Accordingly, it is an object of the invention to provide a semiconductor device having a sufficiently reduced size.

It is a further object of the invention to provide a semiconductor device in which the effect of a field effect transistor is sufficiently suppressed to provide no leakage between the portion of the source and drain regions and the p+ silicon substrate.

It is a still further object of the invention to provide no leakage between the n well and the p+ silicon substrate.

According to the invention, a semiconductor device, comprises:

a semiconductor substrate having a first impurity region of a first conductivity type on a main surface thereof, and a second impurity region of a second conductivity type formed on the first impurity region;

an insulated gate type field effect transistor having source and drain regions of the first conductivity type formed in the second impurity region;

a trench capacitor comprising a storage electrode, a capacitive insulation film surrounding the storage electrode, and an impurity layer of the first conductivity type surrounding the capacitive insulation film excluding a predetermined upper portion of the capacitive insulation film;

wherein the trench capacitor is provided on a surface of the second impurity region of the semiconductor substrate to pass through the second impurity region;

an impurity layer of the second conductivity type extends between and physically contacts the impurity layer of the first conductivity type and one of the source and drain regions, the second conductivity type impurity layer being in opposing relation through an insulation film and through a portion of the capacitive insulation film to the storage electrode; and the storage electrode is connected through a side wall aperture of the capacitive insulation film to the one of the source and drain regions.

BRIEF DESCRIPTION OF THE DRAWINGS

The invention will be explained in more detail in conjunction with appended drawings, wherein.

DESCRIPTION OF THE PREFERRED EMBODIMENT

Figure 1:
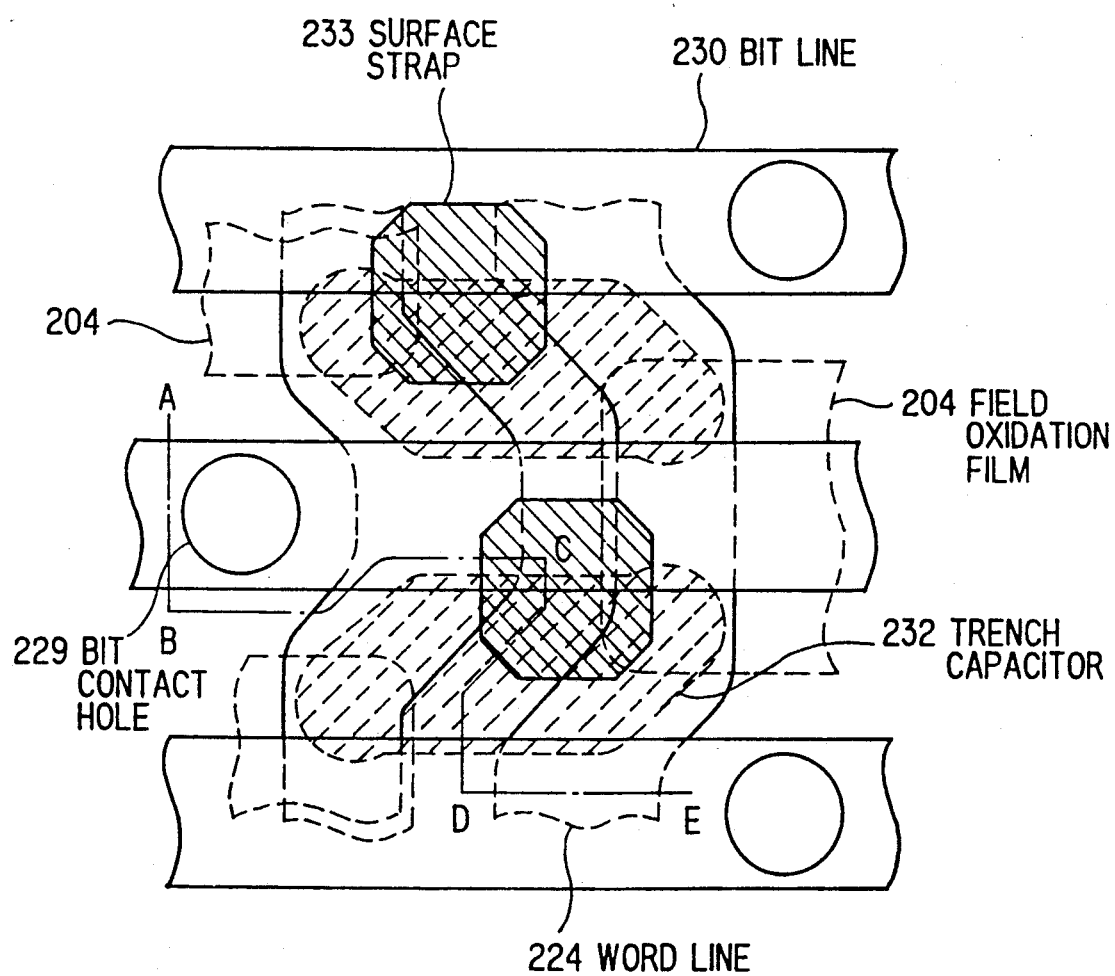
FIG. 1 is a plan schematic view showing a conventional semiconductor device.
Figure 2:
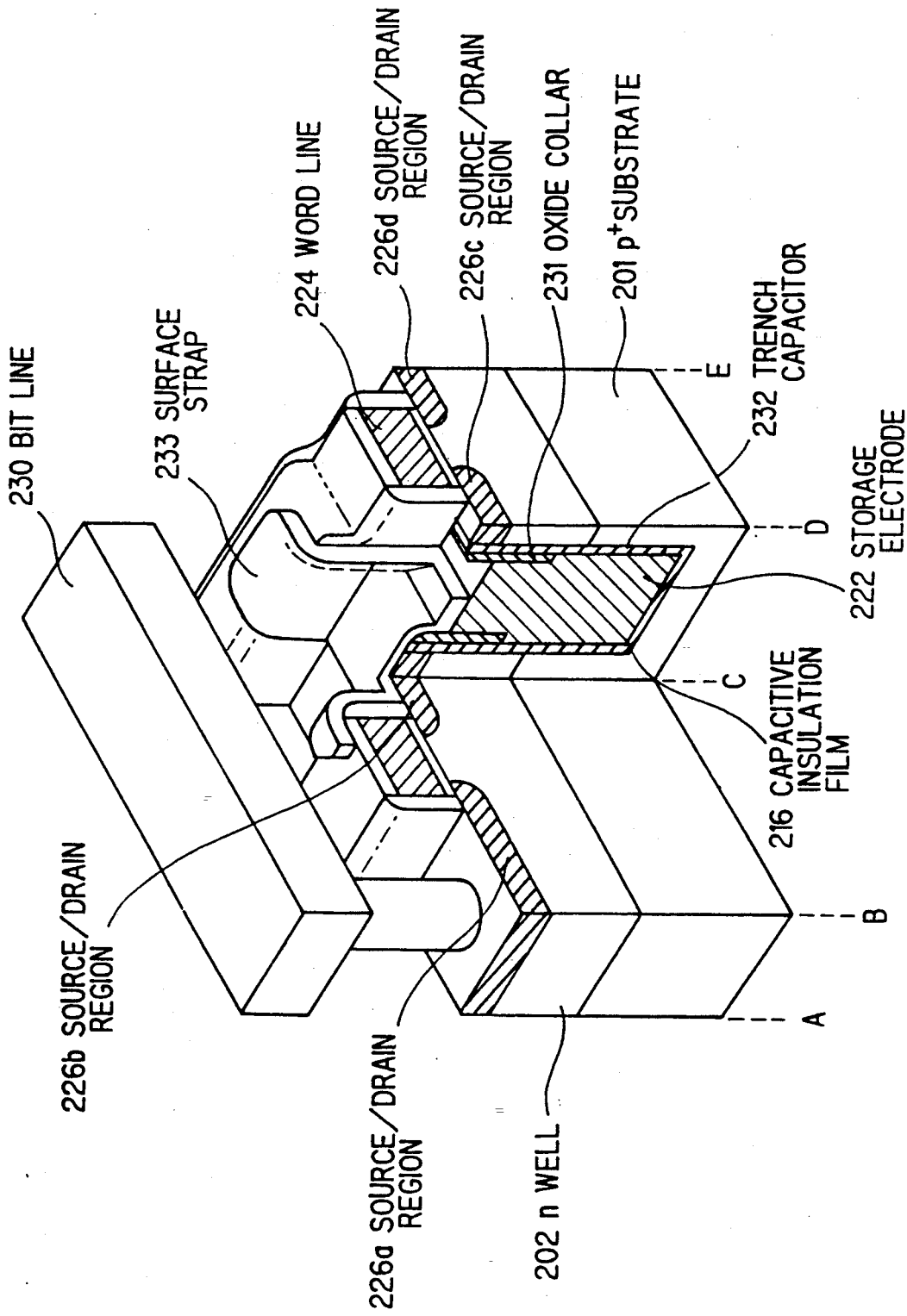
FIG. 2 is a cross-sectional schematic view showing the conventional semiconductor device cut along the line ABCDE in FIG. 1.

Before describing a semiconductor device of a preferred embodiment according to the invention, the aforementioned conventional semiconductor device will be explained in FIGS. 1 and 2.

The conventional semiconductor device of the MINT structure is provided on an n well 202 grown on a p+ substrate 201, in which a trench capacitor 232 separates source and drain regions 226b and 226c, along with field oxide films 204 functioning as device separation means. The trench capacitor 232 includes a capacitive insulation film 216, an oxide collar 231 covering an upper inside surface of the capacitive insulation film 216, and a storage electrode 222 of poly-crystal silicon buried in the trench of the insulation film 216. The storage electrode 222 is connected to the source/drain region 226b by a surface strap 233. In accordance with the provision of the oxide collar 231, the storage electrode 222 functions as a gate electrode, the capacitive insulation film 216 as a gate insulation film, and the n well 202 as a channel region, so that the effect of a parasitic FET generating between the portion of the source and drain regions 226b and 226c and the p+ silicon substrate 201 is relieved, as described before. The remaining structure is the same as in the conventional semiconductor device of the SPT structure, such that the source and drain regions 226a, 226b, 226c and 226d are provided to be in self-alignment relative to a word line 224 functioning as a gate electrode, for instance, to connect the source/drain region 226a through a bit contact hole 229 to a bit line 230.

In this conventional semiconductor device of the MINT structure, however, the aforementioned first to third disadvantages are observed.

Figure 3:
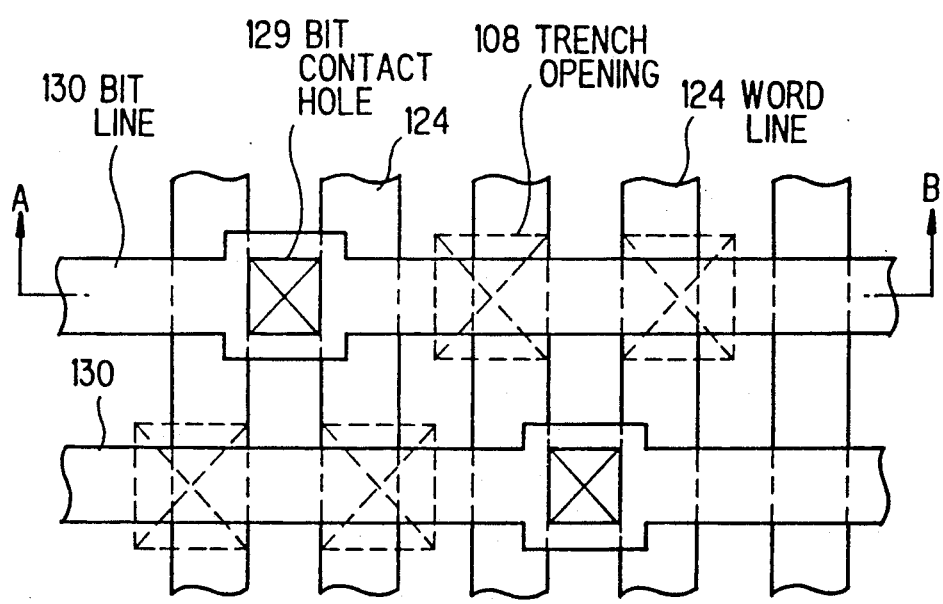
FIG. 3 is a plan schematic view showing a semiconductor device of a preferred embodiment according to the invention.

Next, a semiconductor device of the preferred embodiment will be explained in FIGS. 3 and 4. The semiconductor device is provided on a substrate structure comprising an n substrate (a first impurity region) 101, and a p well (a second impurity region) 102 formed selectively on the n substrate 101, wherein trench capacitors 100 are provided to be passed through the p well 102 from the surface thereof to a predetermined depth of the n substrate 101.

The trench capacitor 100 is structured to include a capacitive insulation film 116 grown on an inner surface thereof, and a storage electrode 122 of n+ poly-crystal silicon buried in a trench of the capacitive insulation film 116. The storage electrode 122 is connected through a trench side wall contact hole 119 provided around a trench opening aperture 108 to an n+ source/drain region (a third impurity region) 126. The trench capacitor 100 is surrounded by an n+ region (a fifth impurity region) 115 extending to the n silicon substrate 101 and facing the storage electrode 122 through the capacitive insulation film 116. The n+ region 115 is electrically isolated from the n+ source/drain region 126 by a p+ region (a sixth impurity region) 110 and a silicon oxide film 112. The p+ region 110 is opposite through the silicon oxide film (an insulation film) 112 and the capacitive insulation film 116 to the storage electrode 122.

An n+ source/drain region (a fourth impurity region) 126a which is not connected to the trench capacitor 100 is connected through a bit contact hole 129 provided selectively on a BPSG film 128 to a bit line 130 of tungsten silicide film. Thus, a DRAM cell is structured by a MOS transistor, so that the DRAM cell is controlled to be in a writing state by a word line 124 functioning as a gate electrode and the bit line 130, wherein the MOS transistor is turned on to store charges through the trench side wall contact hole 119 into the storage electrode 122. In this preferred embodiment, a cell plate which is opposite to the storage electrode 122 is composed of the n silicon substrate 101 and the n+ region 115 which are applied with a predetermined potential.

The semiconductor device of the preferred embodiment may be fabricated in a process as set out below.

Figure 5:
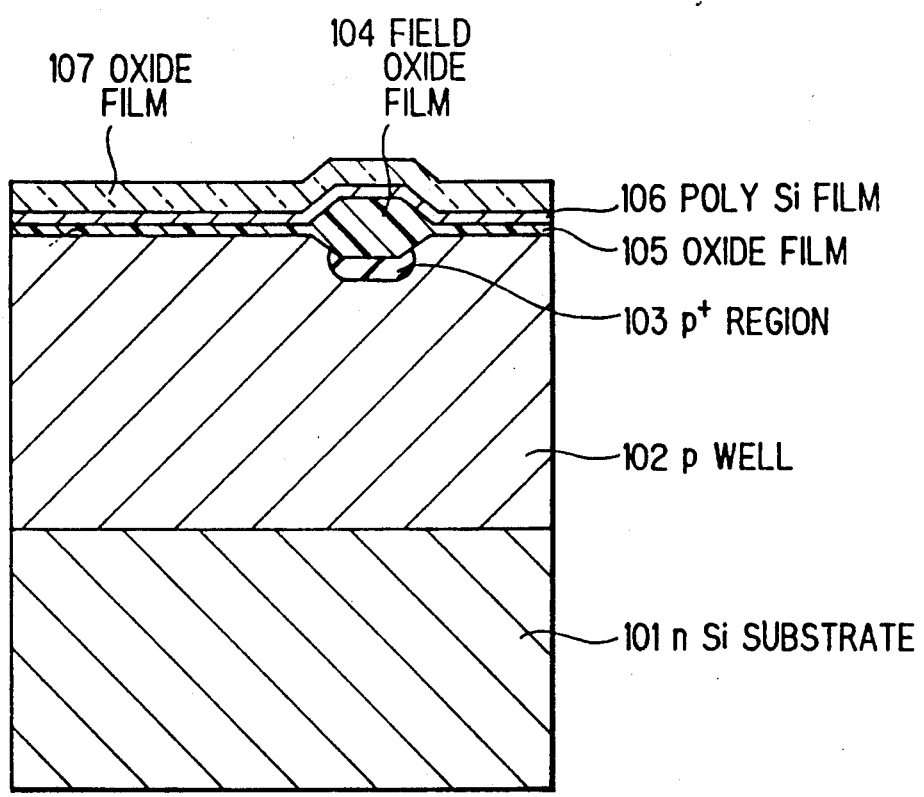
FIG. 5 to 15 are cross-sectional schematic views showing the semiconductor device of the preferred embodiment under a fabrication process cut along the line AB in FIG. 1.

In FIG. 5, a p well 102 is selectively formed on the main surface of an n silicon substrate 101 by a depth of approximately 30 $\mu$m. Then, a field oxide film 104 having a thickness of approximately 500 nm which is provided at the bottom with a p+ region 103 for the channel stop is formed on the surface of the p well 102 by the selective oxidation method. Thereafter, a silicon oxide film 105 having a thickness of approximately 40 nm is formed on the surface of the p well 102 by the thermal oxidation method, and a poly-crystal silicon film 106 having a thickness of approximately 100 nm and a silicon oxide film 107 having a thickness of approximately 600 nm are subsequently formed thereon by the CVD method, respectively. The silicon oxide film 107 is used as a mask in etching the p well 102 and the n silicon substrate 101 to provide trenches, and the poly-crystal silicon film 106 is used as a mask for protecting the field oxide film 104 in removing the silicon oxide film 107 used as the etching mask.

Figure 6:
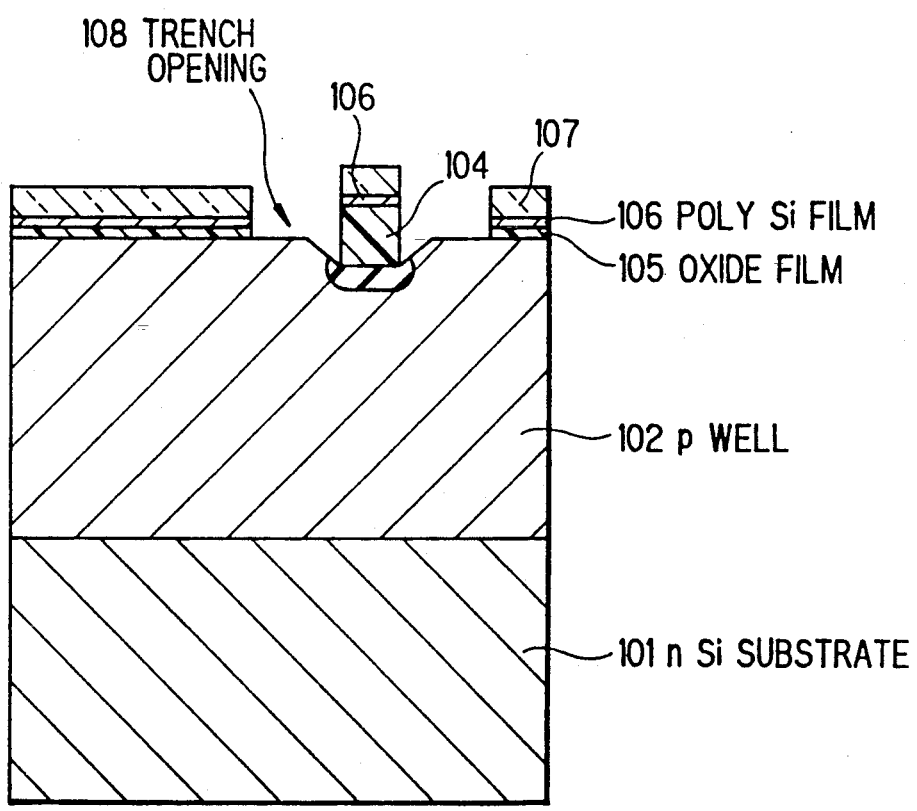

In FIG. 6, a first trench opening aperture 108 is formed by successively etching the silicon oxide film 107, the poly-crystal silicon film 106, the silicon oxide film 105 and the field oxide film 104 to be thereby removed.

Figure 7:
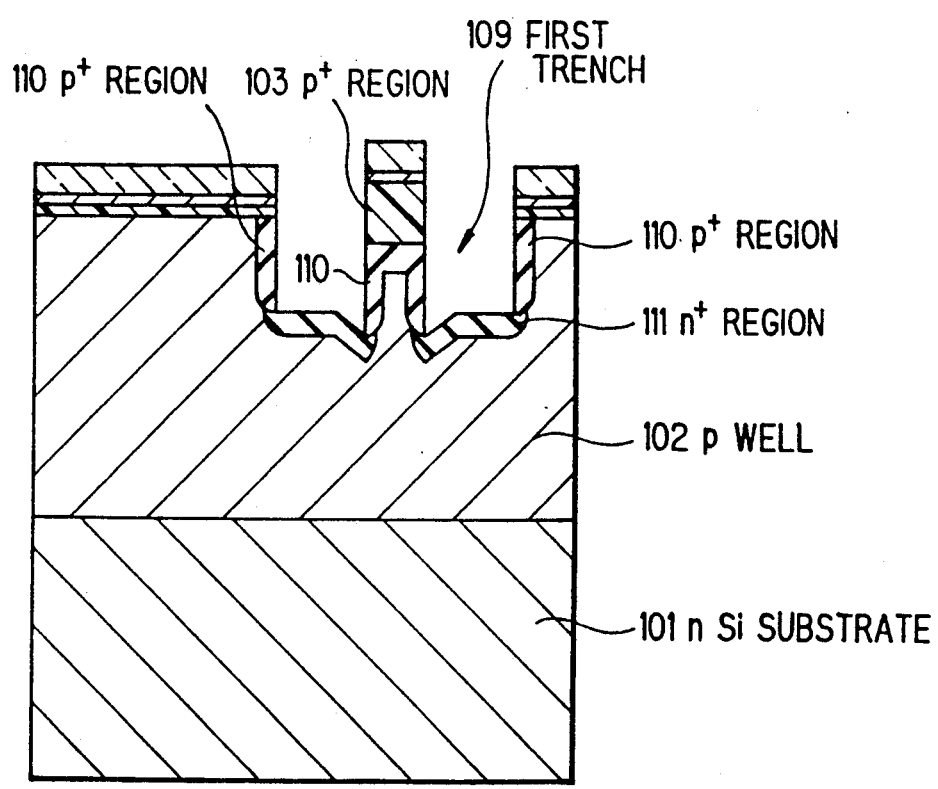

In FIG. 7, a first trench 109 having a depth of approximately 1 $\mu$m is formed on the p well 102 by the anisotropic etching of silicon. Then, a p+ region 110 connected to the formerly formed p+ region 103 is formed on a side wall surface of the first trench 109 by the rotative inclination ion injection method, and an n+ region 111 is formed on the bottom surface of the first trench 109 by ions injected vertically to the silicon substrate 101.

Figure 8:
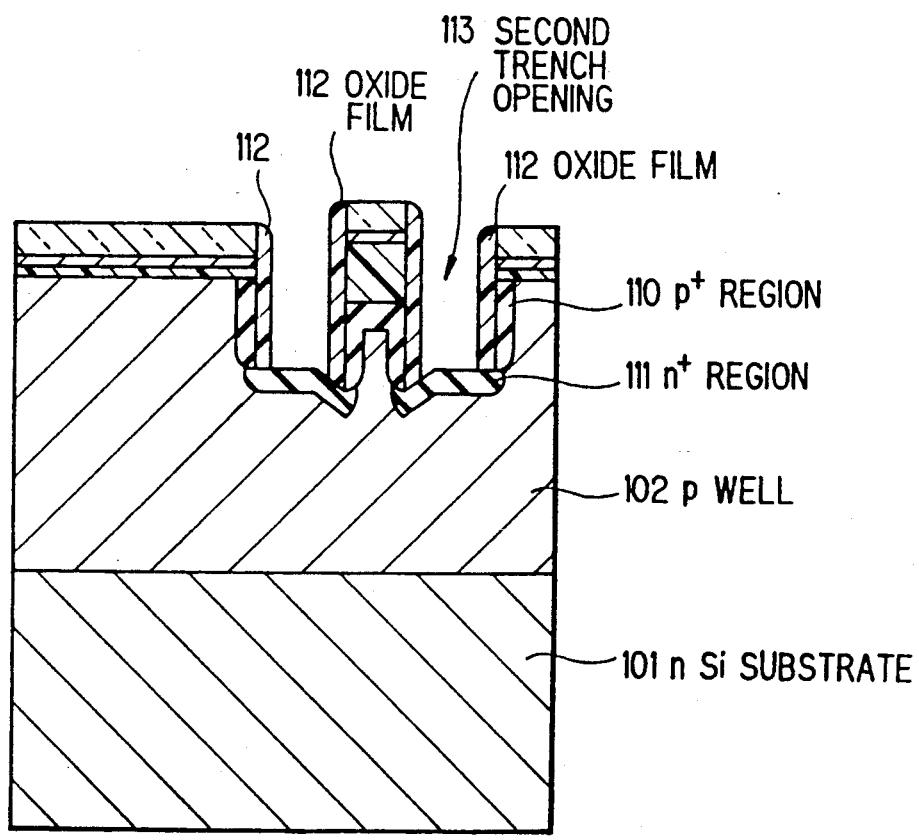

In FIG. 8, a silicon oxide film having a thickness of approximately 150 nm is formed on a whole surface of the above processed substrate, and a silicon oxide film 112 is selectively formed on the side wall of the first trench 109 by the anisotropic etching-back of silicon oxide film. Simultaneously, a second trench opening aperture 113 is formed as shown therein.

Figure 9:
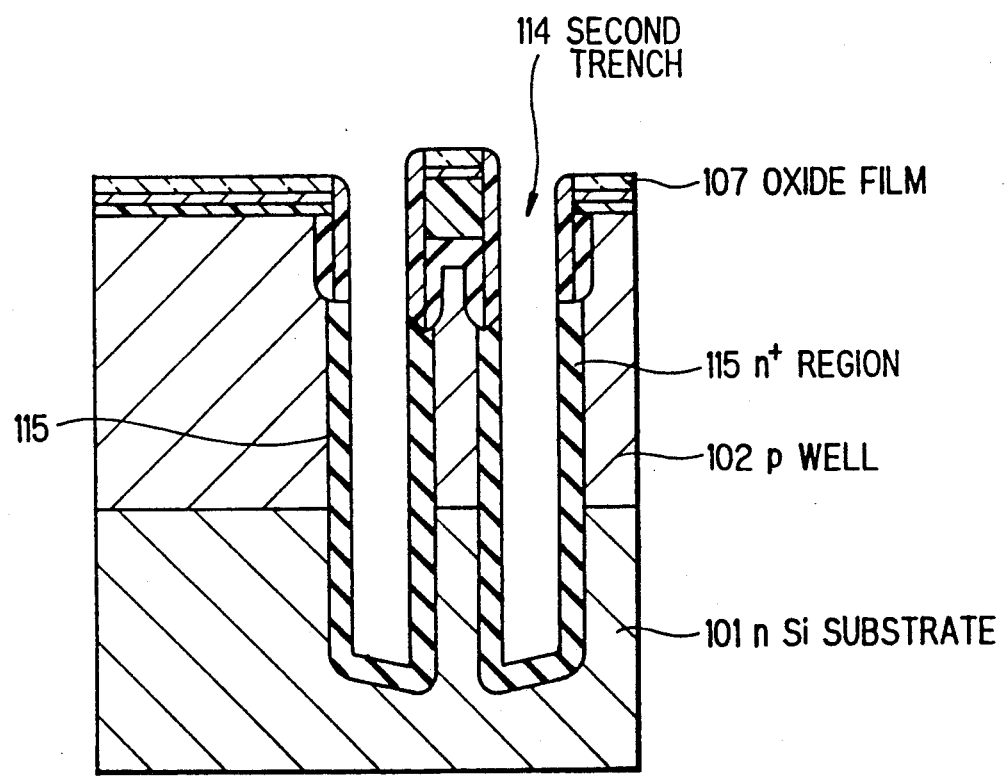

In FIG. 9, a second trench 114 is formed to have a depth of 4 $\mu$m relative to the surface of the p well 102 by the anisotropic etching of silicon, so that the second trench 114 is extended through the p well 102 to the n silicon substrate 101. At this time, the silicon oxide film 107 is etched back by approximately 300 nm. Then, an n+ region 115 which is connected through the n+ region 111 to the p+ region 110 is formed on the side wall surface including the bottom surface of the second trench 114 by the rotative inclination ion injection method and the vertical ion injection method. The n+ region 115 and the n silicon substrate 101 provide the cell plate for the semiconductor device of the preferred embodiment.

Figure 10:
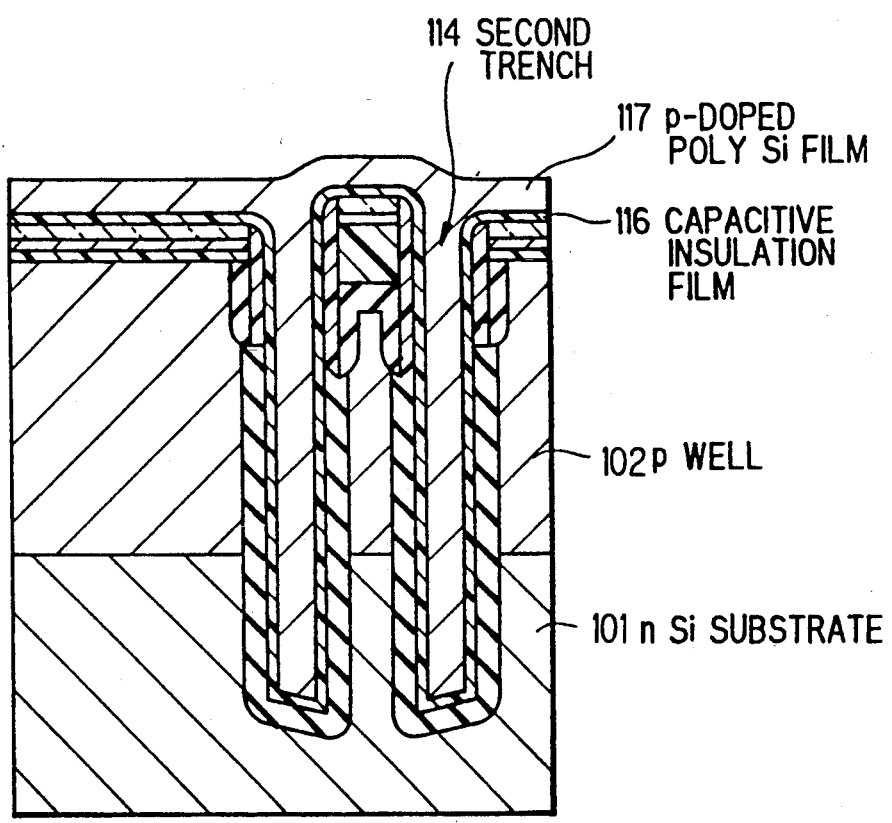

In FIG. 10, a capacitive insulation film 116 is provided to include three layers of a silicon oxide film, a silicon nitride film, and a silicon oxide film having a total thickness which is equal to a single silicon oxide film having a thickness of 6 nm to provide an effective capacitance value. Then, a poly-crystal silicon film 117 doped with phosphorus having a thickness of approximately 600 nm is deposited, so that the second trench 114 is buried with the deposited film 117.

Figure 11:
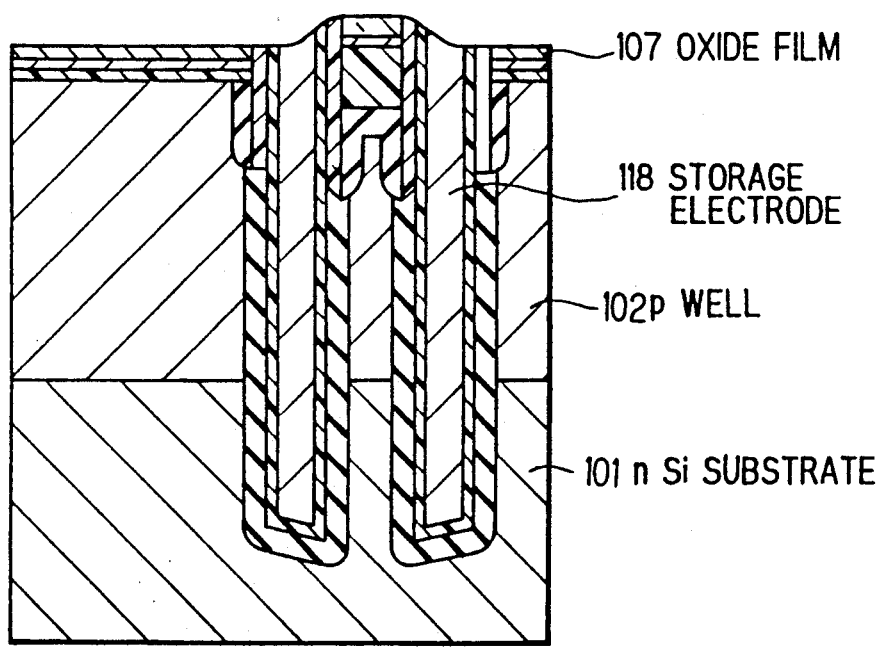

In FIG. 11, the phosphorus doped poly-crystal silicon film 117 and the capacitive insulation film 116 are subsequently etched back, so that a storage electrode 118 is selectively provided for each cell. At this time, the silicon oxide film 107 functions as a protection film of the etching-back, so that the final point of the etching-back can be detected to avoid the excessive etching-back thereof.

Figure 12:
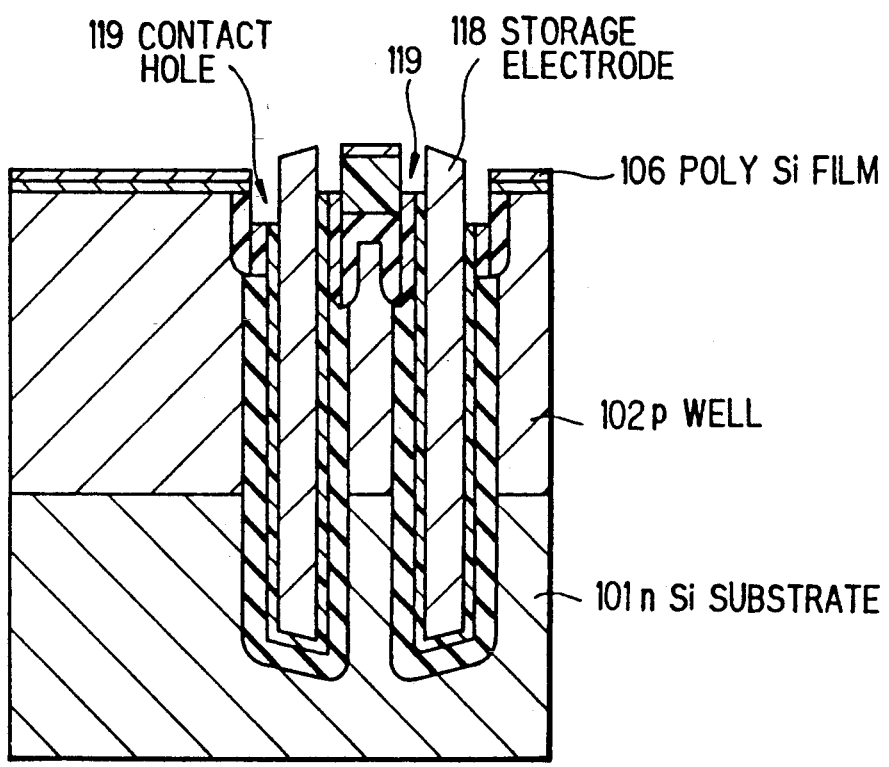

In FIG. 12, trench side wall contact holes 119 having a depth of approximately 200 nm relative to the surface of the p well 102 are provided at the opening aperture of the first trench 109 by the etching-back of the silicon oxide films 107 and 112, and the capacitive insulation film 116. At this time, the poly-crystal silicon film 106 functions as a protection film of the etching-back, so that the final point of the etching-back can be detected to make it easy to control a depth of the trench side wall contact holes 119.

Figure 13:
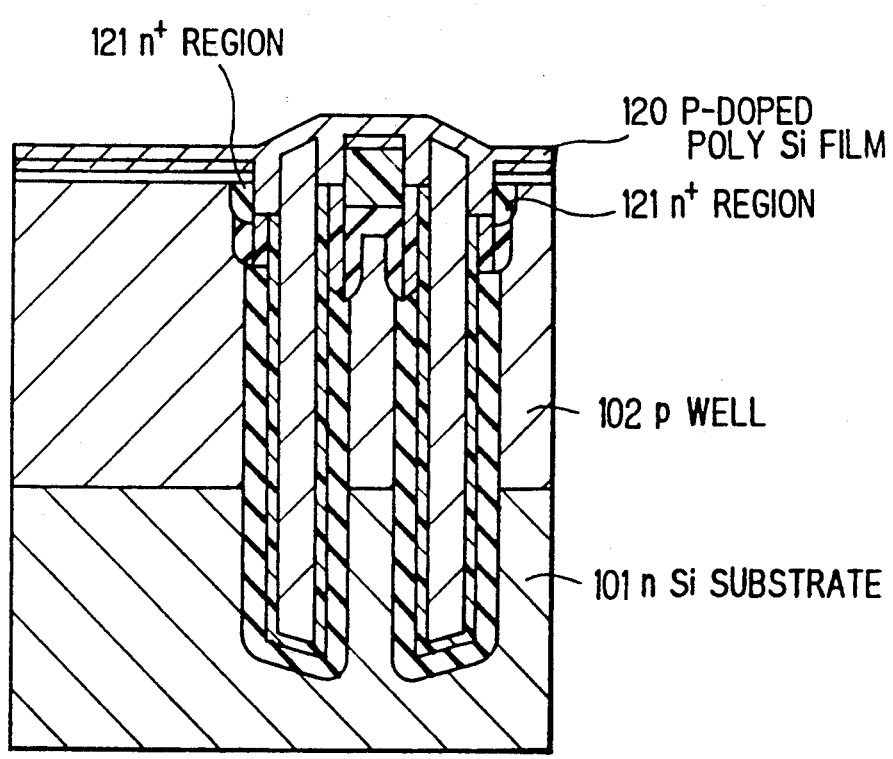

In FIG. 13, a poly-crystal silicon film doped with phosphorus 120 having a thickness of approximately 150 nm is deposited on the whole surface of the processed substrate, so that the trench side wall contact holes 119 are buried with the phosphorus doped poly-crystal silicon film 120. Subsequently, an n+ region 121 is formed in accordance with the diffusion of phosphorus through the trench side wall contact holes 119 from the phosphorus doped poly-crystal silicon film 120 into the p well 102 by the thermal diffusion method. This n+ region 121 will be connected to one of source and drain regions which will be formed at a subsequent stage.

Figure 14:
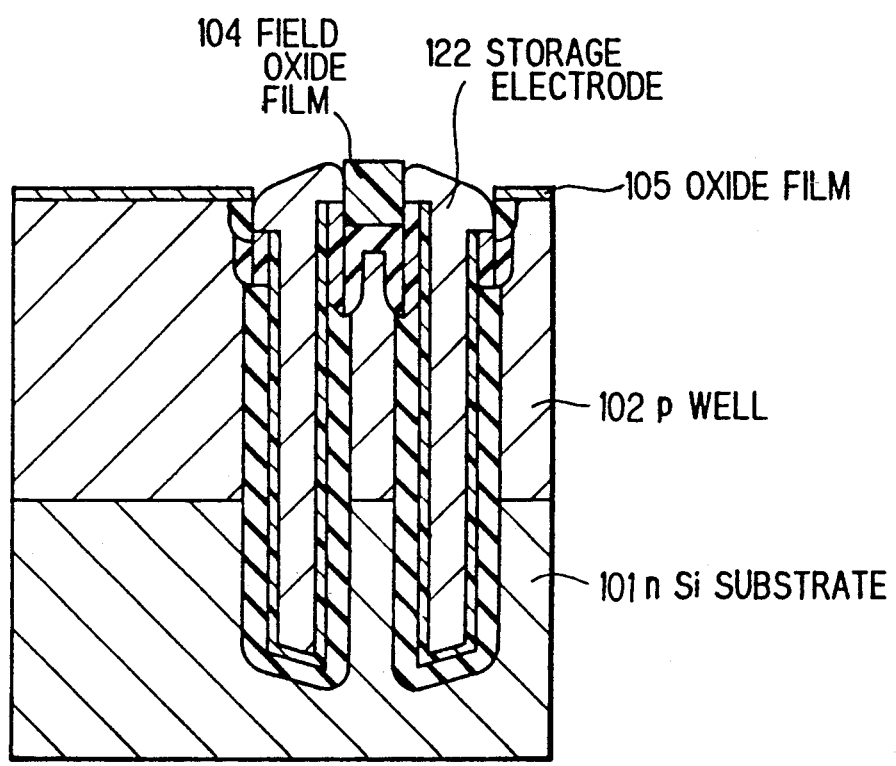

In FIG. 14, a storage electrode 122 connected to the n+ region 121 is obtained by the etching-back of the phosphorus poly-crystal silicon film 120 and the storage electrode 118. In accordance with this etching-back, the aforementioned poly-crystal silicon film 106 is also removed. At this time, the silicon oxide film 105, and the field oxide film 104 function as protection films for the etching-back, so that the final point of the etching-back can be detected to control the height of the storage electrode 122. In addition, the silicon oxide film 105 promotes minimizing damage of the surface of the p well 102 by the above etching-back, so that the characteristics of a MOS transistor to be formed in the semiconductor device of the preferred embodiment are improved.

Figure 15:
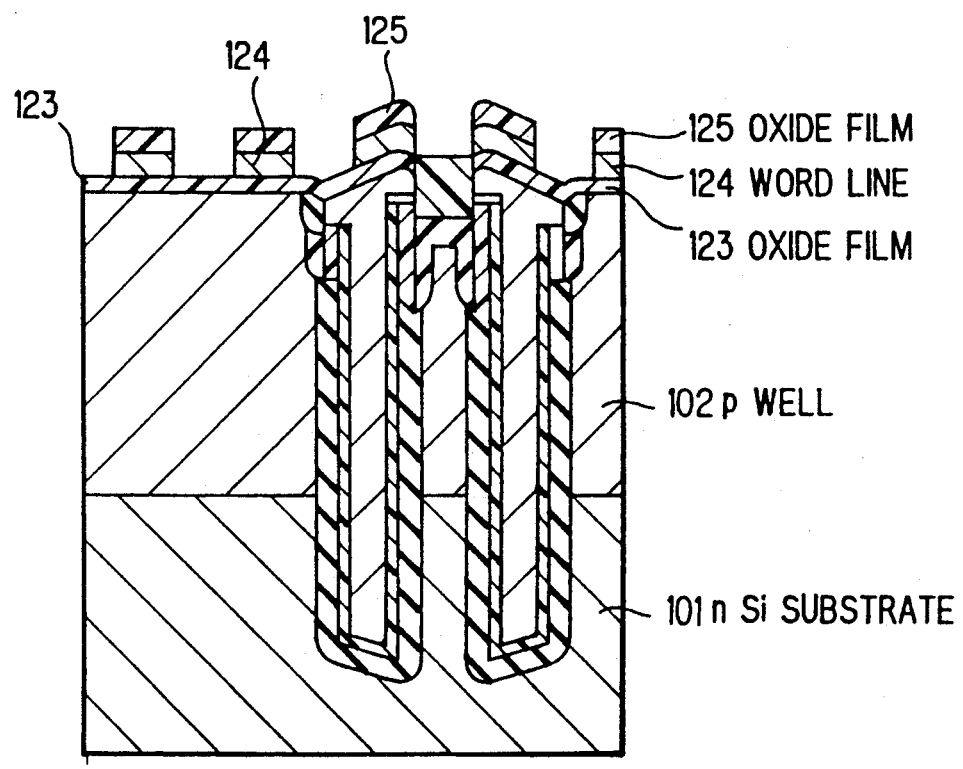

In FIG. 15, the silicon oxide film 105 is removed by etching, and a silicon oxide film 123 having a thickness of approximately 15 nm is formed on a whole surface of the processed substrate by the thermal oxide method. Then, a phosphorus doped poly-crystal silicon film 124 having a thickness of approximately 200 nm and a silicon oxide film 125 having a thickness of approximately 150 nm are successively formed by the CVD method, and are selectively removed to provide gate electrodes (word lines) of the phosphorus doped poly-crystal silicon film 124 and electrode insulation members of the silicon oxide film 125 to be used at a subsequent stage.

Figure 4:
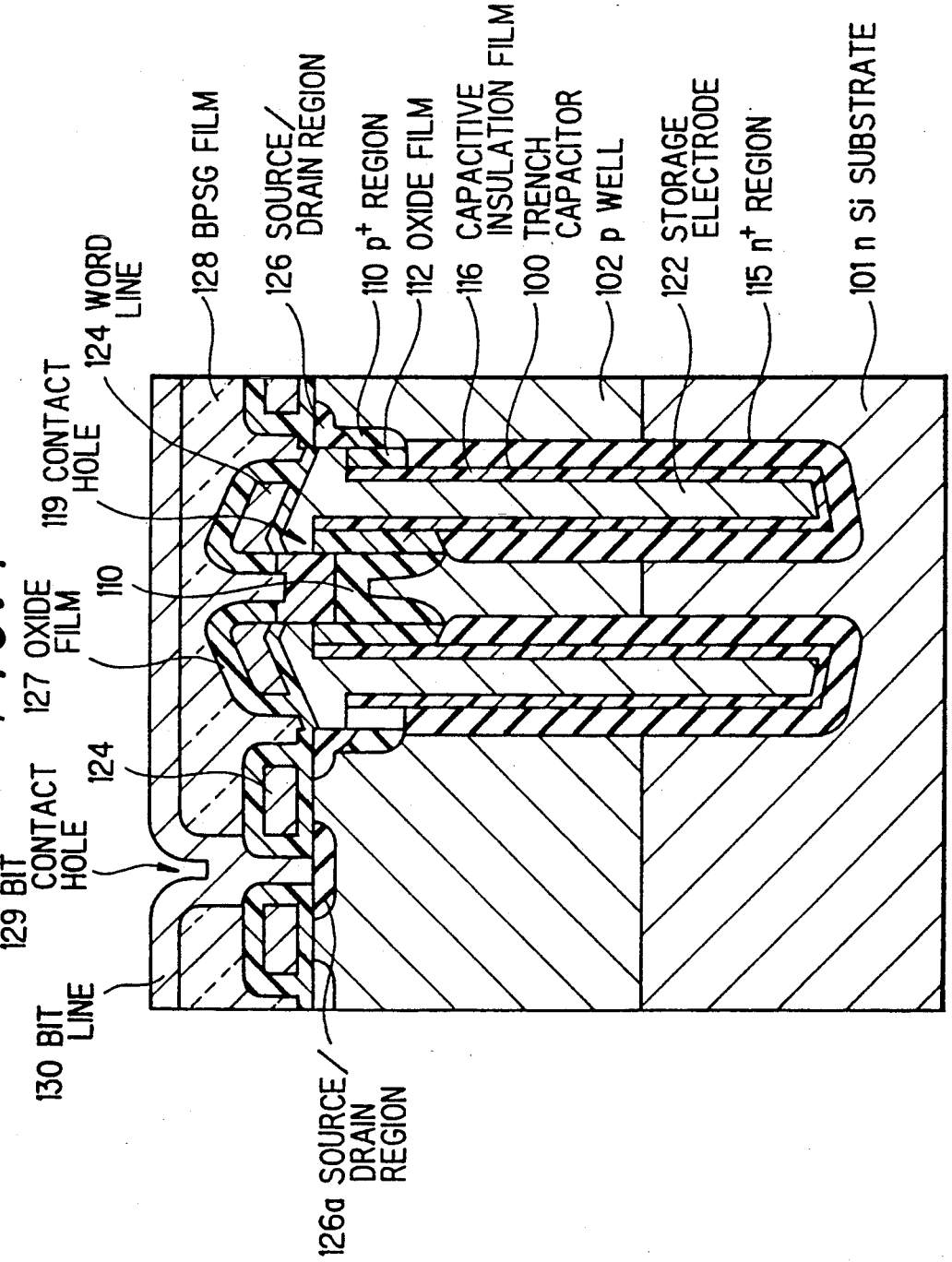
FIG. 4 is a cross-sectional schematic view showing the semiconductor device of the preferred embodiment cut along the line AB in FIG. 3.

With reference to FIG. 4, finally, n+ source and drain regions 126 and 126a are formed to be in self-alignment with the word lines 124 by the ion injection of P or As into the p well 102 and the subsequent thermal treatment thereof. At this time, the source/drain region 126 is connected to the n+ region 121. Then, a silicon oxide film having a thickness of approximately 100 nm is deposited by the CVD method, and is etched back to provide silicon oxide films 127 surrounding the word lines 124. Subsequently, a BPSG film 128 having a thickness of approximately 400 nm is deposited to insulate the electrodes, and is re-flown by the thermal treatment. Thereafter, a bit contact hole 129 is selectively provided, and a tungsten silicide film having a thickness of approximately 150 nm which is then etched to provide a bit line 130 is formed by the sputtering method. Thus, the semiconductor device having a predetermined structure is completed.

In the fabrication process as described above, no photomask is used during the stages of the formation of the first trench opening aperture 108 (FIG. 6) to the storage electrode 122 (FIG. 14). Therefore, no problem occurs in the alignment of the photolithography process, so that a large burden of carrying out the photolithography process is relieved, and it is very advantageous to make a memory cell small in size. In addition, at the time of forming the trench capacitor, it is not necessary that an interconnection region for connecting the storage electrode 122 to the source/drain region 126 be positioned above the trench capacitor, so that a step difference on the surface of the p well 102 is equal to a step difference in forming the field oxide film 104 to decrease a degree of the step difference.

In other words, a photomask is used only for the trench capacitor, so that the source/drain region of the MOS transistor and the storage electrode formed in the trench capacitor can be connected to result in no problem of an alignment error and to make a memory cell small in size.

In the invention, the sixth impurity region exists between the fifth impurity region surrounding the trench capacitor which is a part of the cell plate and the third impurity region (source/drain region) connected to the storage electrode, and is opposite to the storage electrode formed in the trench capacitor, so that the sixth impurity region functions as a channel stopper to suppress the effects of parasitic FET and parasitic GCD.

Although the invention has been described with respect to a specific embodiment for complete and clear disclosure, the appended claims are not to be thus limited but are to be construed as embodying all modifications and alternative constructions that may occur to one skilled in the art which fall within the basic teaching herein set forth. For instance, an n+ burying layer and a p epitaxial layer may be successively provided on the n silicon substrate 101. The n silicon substrate 101 may be replaced by a p silicon substrate having an n+ burying layer thereon. Further, p and n conduction types may be changed for each other in the semiconductor device, wherein a conduction type of the first impurity region formed selectively on the main surface of the silicon substrate is necessarily the same as a conduction type of the source and drain regions.

What is claimed is:

1. A semiconductor device, comprising:
  a semiconductor substrate having a first impurity region of a first conductivity type on a main surface thereof, and a second impurity region of a second conductivity type formed on said first impurity region;
  an insulated gate type field effect transistor having source and drain regions of said first conductivity type formed in said second impurity region;
  a trench capacitor comprising a storage electrode, a capacitive insulation film surrounding said storage electrode, and an impurity layer of said first conductivity type surrounding said capacitive insulation film excluding a predetermined upper portion of said capacitive insulation film;

wherein said trench capacitor is provided on a surface of said second impurity region of said semiconductor substrate to pass through said second impurity region;

an impurity layer of said second conductivity type extends between and physically contacts said impurity layer of said first conductivity type and one of said source and drain regions, said impurity layer of said second conductivity type being in opposing relation through an insulation film and through a portion of said capacitive insulation film to said storage electrode; and said storage electrode is connected through a side wall aperture of said capacitive insulation film to said one of said source and drain regions.

2. A semiconductor device according to claim 1, wherein:

said trench capacitor is extended into said first impurity region of said semiconductor device by a predetermined depth.

3. A semiconductor device, comprising:

a semiconductor substrate which is selectively provided on a main surface thereof with a first impurity region of a first conductivity type, and on said first impurity region with a second impurity region of a second conductivity type;

an insulated gate type field effect transistor having source and drain regions, said source and drain regions being third and fourth impurity regions of said first conductivity type formed in said second impurity region;

a trench capacitor having a contact portion which is connected to said third impurity region, said trench capacitor being provided on a surface of said second impurity region to pass through said second impurity region;

a capacitive insulation film provided on an inner wall surface of said trench capacitor excluding said contact portion;

a conductor formed to cover said capacitive insulation film, said conductor being connected at said contact portion to said third impurity region;

a fifth impurity region surrounding said capacitive insulation film at a portion separated from said third impurity region, said fifth impurity region being of said first conductivity type;

a sixth impurity region extending between and physically contacting said third and fifth impurity regions, said sixth impurity region being of said second conductivity type; and an insulation film provided adjacently between a portion of said capacitive insulation film and a portion of said sixth impurity region, said insulation film being adjacent to a portion of said fifth impurity region.

* * * * *